United States Patent [19]
Sono et al.

[11] Patent Number: 5,296,740
[45] Date of Patent: Mar. 22, 1994

[54] METHOD AND APPARATUS FOR A SEMICONDUCTOR DEVICE HAVING A RADIATION PART

[75] Inventors: Michio Sono; Junichi Kasai, both of Kawasaki, Japan

[73] Assignee: Fujitsu Limited, Kawasaki, Japan

[21] Appl. No.: 851,208

[22] Filed: Mar. 13, 1992

[51] Int. Cl.$^5$ .................... H01L 23/02; H01L 23/28; H01L 23/12

[52] U.S. Cl. .................... 257/706; 257/702; 257/796

[58] Field of Search .................. 357/81, 72, 74, 80; 257/702, 704, 705, 706, 707, 712, 720, 713, 788, 789, 796

[56] References Cited

U.S. PATENT DOCUMENTS

| | | | |
|---|---|---|---|
| 4,835,598 | 5/1989 | Higuchi et al. | 357/81 |
| 5,057,903 | 10/1991 | Olla | 357/81 |
| 5,151,777 | 9/1992 | Akin et al. | 357/81 |

FOREIGN PATENT DOCUMENTS

55-88358  4/1980  Japan .

*Primary Examiner*—Sheila V. Clark
*Attorney, Agent, or Firm*—Staas & Halsey

[57] ABSTRACT

A semiconductor device includes a stage having top and bottom surfaces, a semiconductor element which is mounted on the top surface of the stage, a package part which is made of a first resin and encapsulates the semiconductor element so that a surface of the package part and the bottom surface of the stage lie on substantially the same plane, and a radiation part which is made of a second resin and is provided directly on the bottom surface of the stage and the surface of the package part. The second resin includes a filler material selected from a group consisting of metal powders and insulator powders so that a thermal conduction of the second resin is greater than that of the first resin.

6 Claims, 7 Drawing Sheets

METHOD AND APPARATUS FOR A SEMICONDUCTOR DEVICE HAVING A RADIATION PART

CROSS-REFERENCE TO RELATED APPLICATION

The present application is related to U.S. application Ser. No. 07/786,775 dated Nov. 1, 1991 in which one of the assignees is the same as the assignee of the present application.

BACKGROUND OF THE INVENTION

The present invention generally relates to semiconductor devices and methods of producing the same, and more particularly to a semiconductor device having a radiation part for radiating heat and a method of producing such a semiconductor device.

There are semiconductor elements which generate heat during operation, and it is necessary to efficiently cool such semiconductor elements. Conventionally, there is a semiconductor device having radiation fins for cooling the semiconductor element provided on a package which encapsulates the semiconductor element. From the functional point of view, it is desirable that the radiation fins have a high radiation characteristic. On the other hand, from the production point of view, it is desirable that the radiation fins can be produced at a low cost.

Figure 1:
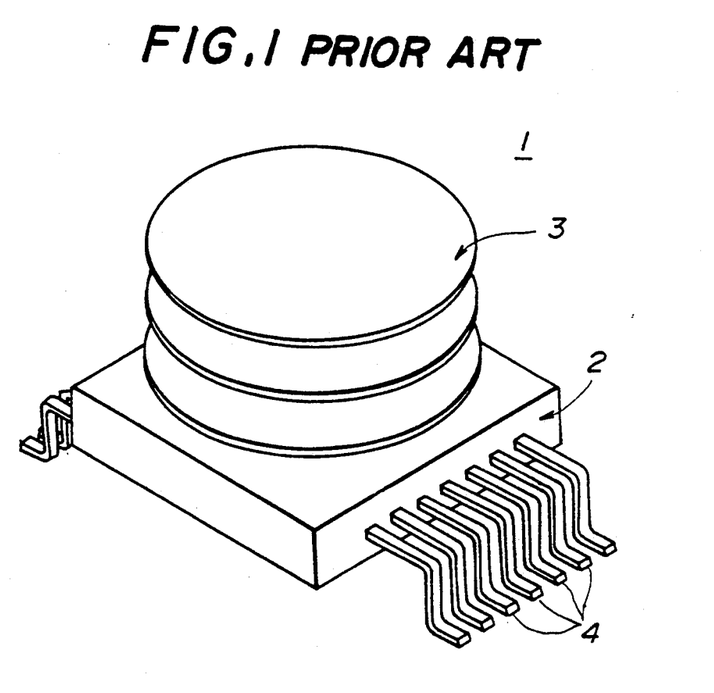
FIG. 1 is a perspective view of an example of a conventional semiconductor device.
Figure 2:
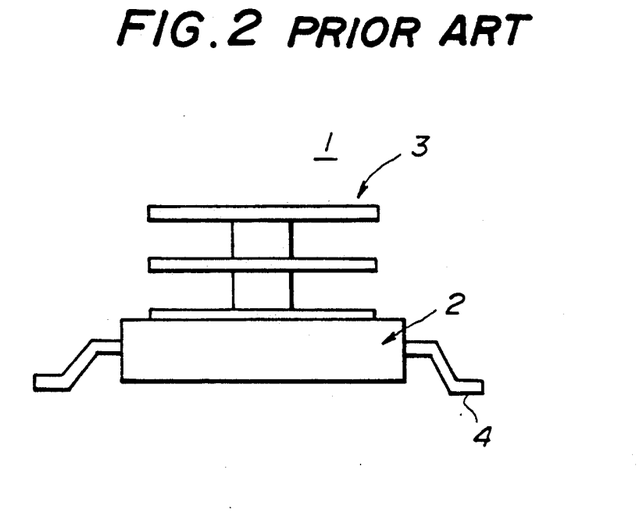
FIG. 2 is a side view of the conventional semiconductor device shown in FIG. 1.

FIGS. 1 and 2 show an example of the conventional semiconductor device. A semiconductor device 1 generally includes a package 2 and radiation fins 3. The package 2 is made of a resin, while the radiation fins 3 are made of a metal such as aluminum.

The package 2 encapsulates a semiconductor element (not shown) by a resin molding, and the semiconductor element is protected by this package 2. A plurality of lead frames 4 are provided as shown. The lead frames 4 connect to the semiconductor element within the package 2, and also project from the package 2 so that the lead frames 4 may be connected to a circuit substrate or the like.

In order to improve the radiation efficiency of the radiation fins 3, the radiation fins 3 are shaped so that the surface area thereof is increased. Conventionally, an adhesive agent having a satisfactory thermal conductivity is used to mount the radiation fins 3 on the package 2.

However, according to the conventional semiconductor device 1, the package 2 is made of the resin while the radiation fins 3 are made of the metal. For this reason, the package 2 and the radiation fins 3 must be produced by independent processes, and there is a problem in that the production process of the semiconductor device 1 becomes complex. In addition, the radiation fins 3 have a complicated shape so as to improve the radiation efficiency. As a result, there are problems in that it is troublesome and difficult to form the complicated shape of the radiation fins 3 from the metal, the process of forming the radiation fins 3 is unsuited for mass production, and the cost of the radiation fins 3 and thus the cost of the semiconductor device 1 becomes high.

On the other hand, because the radiation fins 3 are bonded onto the package 2 using the adhesive agent, the strength and heat resistance at the bonded part are poor. Furthermore, the radiation characteristic at the bonded part is inconsistent because of voids generated at the bonding surface and/or within the adhesive agent. For these reasons, there is a problem in that the reliability of the semiconductor device 1 becomes poor. Moreover, there is also a problem in that it is difficult to control the positioning accuracy of the radiation fins 3 with respect to the package 2 and the height of the radiation fins 3 when the adhesive agent is used to mount the radiation fins 3 on the package 2.

SUMMARY OF THE INVENTION

Accordingly, it is a general object of the present invention to provide a novel and useful semiconductor device and method of producing the semiconductor device, in which the problems described above are eliminated.

Another and more specific object of the present invention is to provide a semiconductor device comprising a stage having top and bottom surfaces, a semiconductor element which is mounted on the top surface of the stage, a package part which is made of a first resin and encapsulates the semiconductor element so that a surface of the package part and the bottom surface of the stage lie on substantially the same plane, and a radiation part which is made of a second resin and is provided directly on the bottom surface of the stage and the surface of the package part, where the second resin includes a filler material selected from a group consisting of metal powders and insulator powders so that a thermal conduction of the second resin is greater than that of the first resin. According to the semiconductor device of the present invention, it is possible to integrally form the radiation part and the package part because the two are made of resins, without the use of an adhesive agent. For this reason, the connection between the radiation part and the package part is strong and moisture resistant. Further, the thermal conduction is satisfactory because the heat is transmitted directly to the radiation part from the package part, without being transmitted via the adhesive agent. In addition, the semiconductor device can be made light because of the light radiation part.

Still another object of the present invention is to provide a method of producing a semiconductor device which comprises a stage, a semiconductor element which is mounted on the stage and encapsulated within a package part, and a radiation part provided on the package part, comprising the steps of (a) forming the package part from a first resin so that a surface of the package part and a first surface of the stage opposite to a second surface on which the semiconductor element is mounted lie on substantially the same plane, and (b) forming the radiation part from a second resin so that the radiation part is provided directly on the first surface of the stage and the surface of the package part, where the second resin includes a filler material selected from a group consisting of metal powders and insulator powders so that a thermal conduction of the second resin is greater than that of the first resin. According to the method of the present invention, both the radiation part and the package part can be formed by molding processes because the two are made of resins. Hence, the production process can be simplified compared to the conventional method.

Other objects and further features of the present invention will be apparent from the following detailed description when read in conjunction with the accompanying drawings.

DESCRIPTION OF THE PREFERRED EMBODIMENTS

Figure 3:
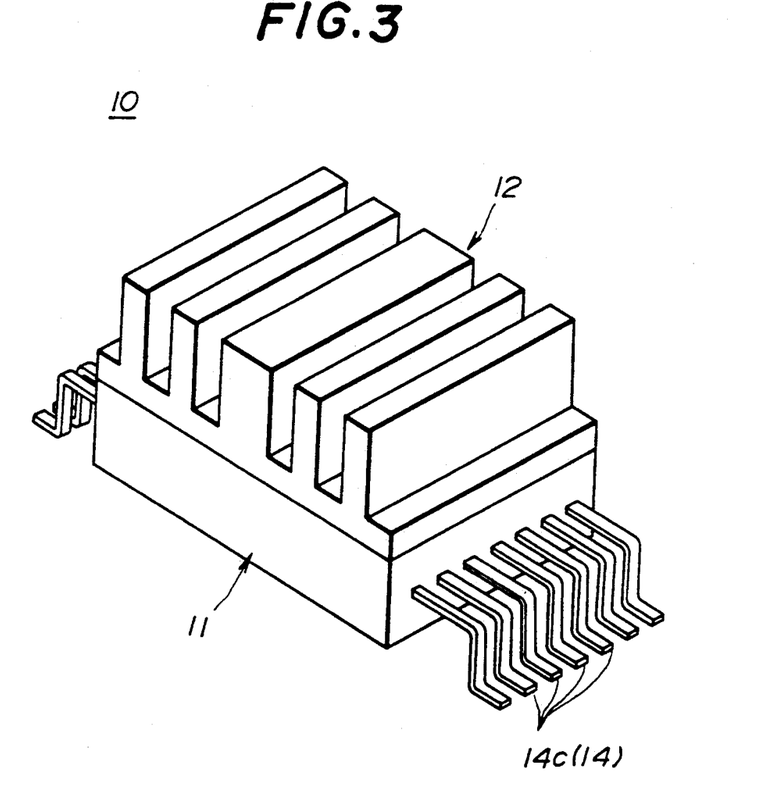
FIG. 3 is a perspective view of a first embodiment of a semiconductor device according to the present invention.
Figure 4:
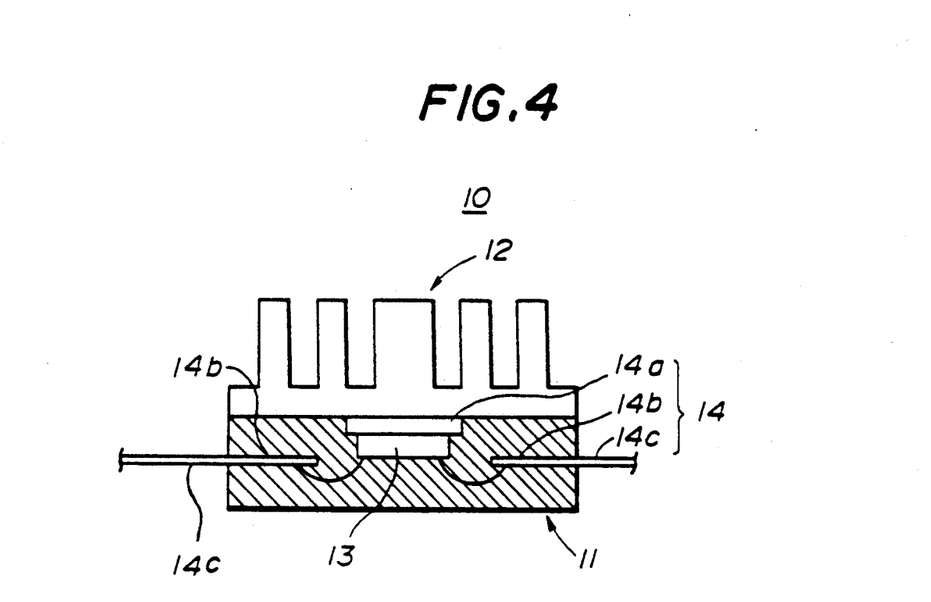
FIG. 4 is a cross sectional view of a vertical cross section of the first embodiment shown in FIG. 3.
Figure 5:
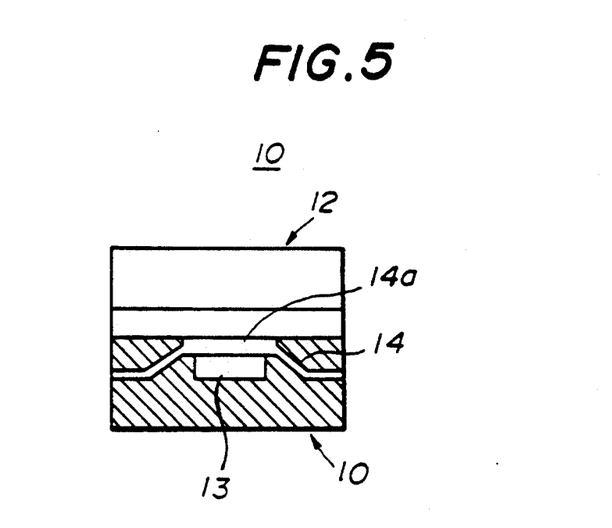
FIG. 5 is a cross sectional view of a horizontal cross section of the first embodiment shown in FIG. 3.

FIG. 3 shows a perspective view of a first embodiment of the semiconductor device according to the present invention, FIG. 4 shows a vertical cross section of the first embodiment, and FIG. 5 shows a horizontal cross section of the first embodiment.

A semiconductor device 10 shown in FIGS. 3 through 5 generally includes a package part 11 and a radiation fin part 12. The package part 11 is made of an epoxy resin, and is the so-called dip type, which encapsulates a semiconductor element 13, and a lead frame 14. For example, the lead frame 14 is made of KOVAR TM material (Kovar is a trademark of Westinghouse Corporation for an iron-nickel-cobalt alloy material). The semiconductor element 13 is encapsulated by the resin in a state where the semiconductor element 13 is die-bonded on a stage 14a of the lead frame 14. This stage 14a is bent so that the semiconductor element 13 is mounted at a concave part of the stage 14a. When forming the package part 11, this bent structure of the stage 14a enables the stress of the resin to be absorbed by the resilient deformation of the stage 14a so as to minimize the damage to the semiconductor element 13. In addition, the stage 14a is bent to a relatively large degree in this embodiment, so that the back surface part of the stage 14a at the part where the semiconductor element 13 is mounted is exposed at the package surface of the package part 11 and makes direct contact with the radiation fin part 12, which will be described later.

The semiconductor element 13 on the stage 14a is connected to inner leads 14b of the lead frame 14 by wire-bonding. In addition, outer leads 14c of the lead frame 14 extend outwardly of the package part 11 so that the outer leads 14c may be connected to an external circuit substrate or the like.

The radiation fin part 12 forms an essential part of the present invention, and is characterized in that the radiation fin part 12 is made of a resin. The epoxy resin forming the radiation fin part 12 includes a filler such as a metal powder and a insulator powder. For example, the metal powder may be selected from gold (Au), silver (Ag), aluminum (Al), copper (Cu) and nickel (Ni) powders. On the other hand, the insulator powder may be selected from aluminum nitride (AlN), alumina ($Al_2O_3$) and boron nitride (BN) powders. The filler is added to increase the thermal resistance, but the insulative characteristic must be maintained. For this reason, the resistance of the filler material should be greater than $10^{10}$ Ohms, and more desirably, greater than $10^{12}$ Ohms Unlike the resin used for the normal encapsulation, the requirements of the epoxy resin forming the radiation fin part 12 are not as strict as regards to the impurity concentration, the molding characteristic and the moisture resistance, as long as the impurity concentration is extremely low. This is because the function of the radiation fin part 12 is to cool the semiconductor element 13 which is encapsulated within the package part 11, and not to encapsulate the semiconductor element 13 as in the case of the package part 11. It is desirable, however, that the epoxy resin which forms the radiation fin part 12 makes a satisfactory adherence with respect to the resin which forms the package part 11, and that the thermal expansion coefficients of the epoxy resin forming the radiation fin part 12 and the resin forming the package part 11 are approximately the same.

Because the metal powder or the like is mixed into the epoxy resin which forms the radiation fin part 12, the thermal conductivity of this epoxy resin is high compared to that of the normal resin and the radiation characteristic of the epoxy resin is improved. For this reason, it is possible to realize a sufficient radiation effect even though the radiation fin part 12 is made of the epoxy resin. In addition, the shape of the radiation fin part 12 becomes complicated if the radiation efficiency is improved by increasing the surface area of the radiation fin part 12, but the forming of the complicated shape is relatively easy since the radiation fin part 12 is made of the epoxy resin.

In this embodiment, the radiation fin part 12 is integrally mounted on the package part 11. More particularly, when molding the radiation fin part 12, the radiation fin part 12 is directly molded on the package part 11 so as to integrally form the package part 11 and the radiation fin part 12.

Next, a description will be given of a first embodiment of a method of producing the semiconductor device according to the present invention, by referring to FIGS. 6 through 8. In this embodiment of the method, it is assumed for the sake of convenience that the semiconductor device 10 described above is produced.

First, the semiconductor element 13 is die-bonded on the stage 14a of the lead frame 14 by a die-bonding material. Then, bonding pads of the semiconductor element 13 and the inner leads 14b are wire-bonded by gold wires, copper wires or the like. Next, the lead frame 14, which is mounted with the semiconductor element 13, is mounted on a metal die 15, which is used for forming the package part 11, and a resin (epoxy resin) is injected into the metal die 15. This metal die 15 is made up of an upper die 15a and a lower die 15b.

Figure 6:
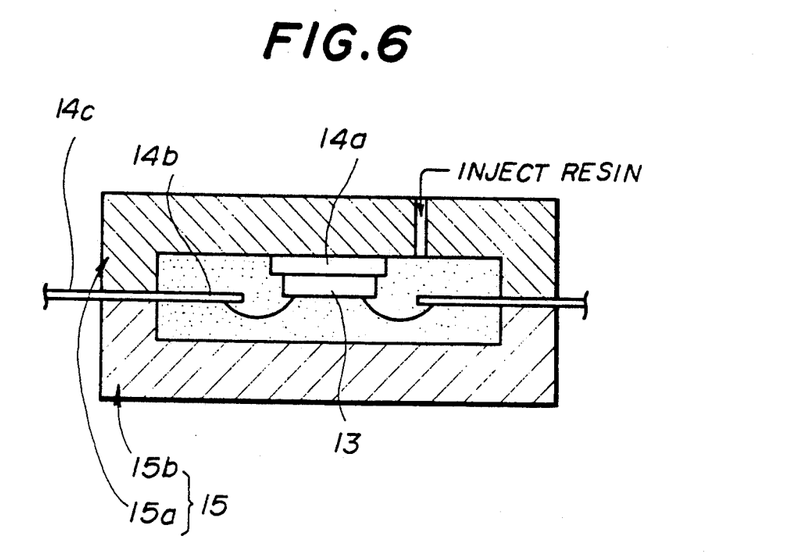
FIG. 6 is a cross sectional view for explaining the molding of a package part.

FIG. 6 shows the metal die 15 in a state where the resin is injected, where the shaded area shows the injected resin. As shown, when forming the package part 11, the molding is carried out in a state where a back surface 14a-1 of the stage 14a having the semiconductor element 13 die-bonded thereon makes contact with the metal die 15 virtually without a gap. More particularly, the stage 14a is bent as described above, and the semiconductor element 13 is mounted in the concave part of the stage 14a. For this reason, the stage 14 is pushed slightly downwards by utilizing the flexibility introduced by this structure of the stage 14a, so that the metal die 15 (upper die 15a) and the stage 14a make contiguous contact. As a result, it is possible to mold the package part 11 in the state where the back surface 14a-1 of the stage 14a makes contact with the metal die 15 virtually without a gap.

Figure 7:
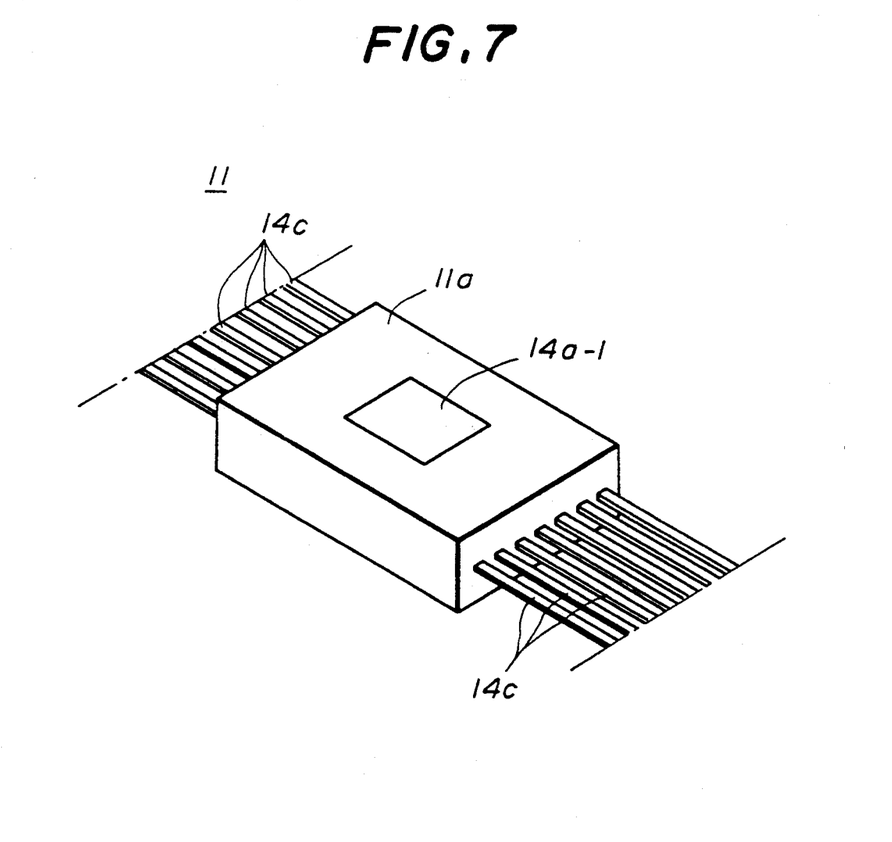
FIG. 7 is a perspective view of the molded package part.
Figure 8:
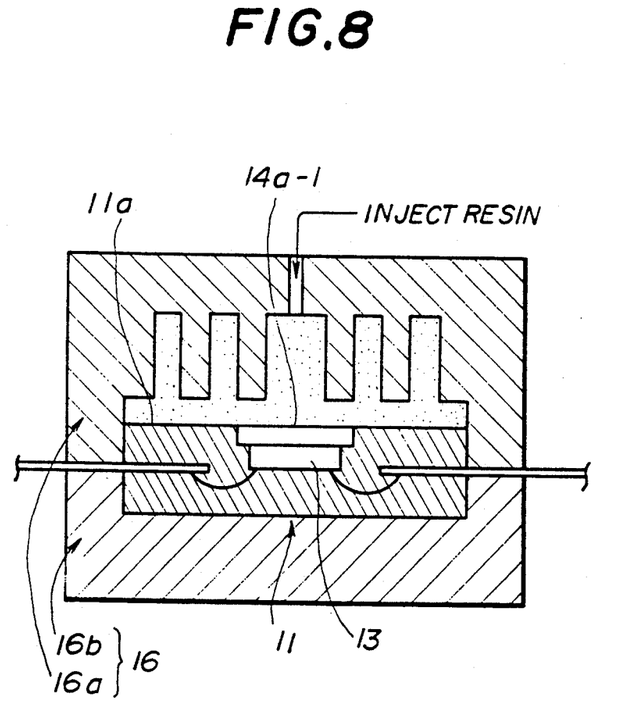
FIG. 8 is a cross sectional view for explaining the molding of radiation fins.

The package part 11 which is formed by the above described process is shown in FIG. 7. As shown, the back surface 14a-1 of the stage 14a is exposed at the package surface of the package part 11. The package surface of the package part 11 where the back surface 14a-1 is exposed will be referred to as a connecting surface 11a. The back surface 14a-1 of the stage 14a and the connecting surface 11a of the package part 11 lie on substantially the same plane. Although the back surface 14a-1 is exposed at the connecting surface 11a, this will not deteriorate the encapsulation of the semiconductor element 13. When injecting the resin, a jig may be used to push the semiconductor element 13 upwardly in FIG. 6 so that the back surface 14a-1 is positively exposed at the connecting surface 11a.

When the package part 11 is formed in the above described manner, the package part 11 is mounted in a metal die 16 and an epoxy resin which is added with the filler material is injected into the metal die 16. The metal die 16 is made up of an upper die 16a and a lower die 16b. FIG. 8 shows the metal die 16 in a state where the epoxy resin is injected, where the shaded area shows the injected epoxy resin. The epoxy resin is injected on the connecting surface 11a of the package part 11 so that the radiation fin part 12 is formed on the connecting surface of the package part 11. Hence, the radiation fin part 12 is formed directly on the back surface 14a-1 of the stage 14a exposed at the connecting surface 11a.

Accordingly, the heat, which is generated from the semiconductor element 13 on the stage 14a, is transmitted directly to the radiation fin part 12 via the stage 14a. Consequently, the thermal conduction is very satisfactory, and it is possible to cool the semiconductor element 13 with a high efficiency.

On the other hand, the radiation fin part 12 is directly molded on the package part 11, and no adhesive agent is used. For this reason, the strength and moisture resistance at the part where the radiation fin part 12 and the package part 11 connect are satisfactory, and it is possible to improve the reliability of the semiconductor device 10. Compared to the conventional method of adhering the radiation fin part on the package part using the adhesive agent, this method of molding the radiation fin part 12 on the package part 11 improves the positioning accuracy of the radiation fin part 12 with respect to the package part 11 and also improves the dimension accuracy of the radiation fin part 12. Hence, it is possible to improve the reliability of the semiconductor device 10 also from these points of view.

Furthermore, the productivity is improved by forming both the package part 11 and the radiation fin part 12 by resin molding processes, thereby making it possible to produce the semiconductor device 10 at a low cost. It is also easy to form the radiation fin part 12, which has a complicated shape, by modifying the metal die 16.

Figure 9:
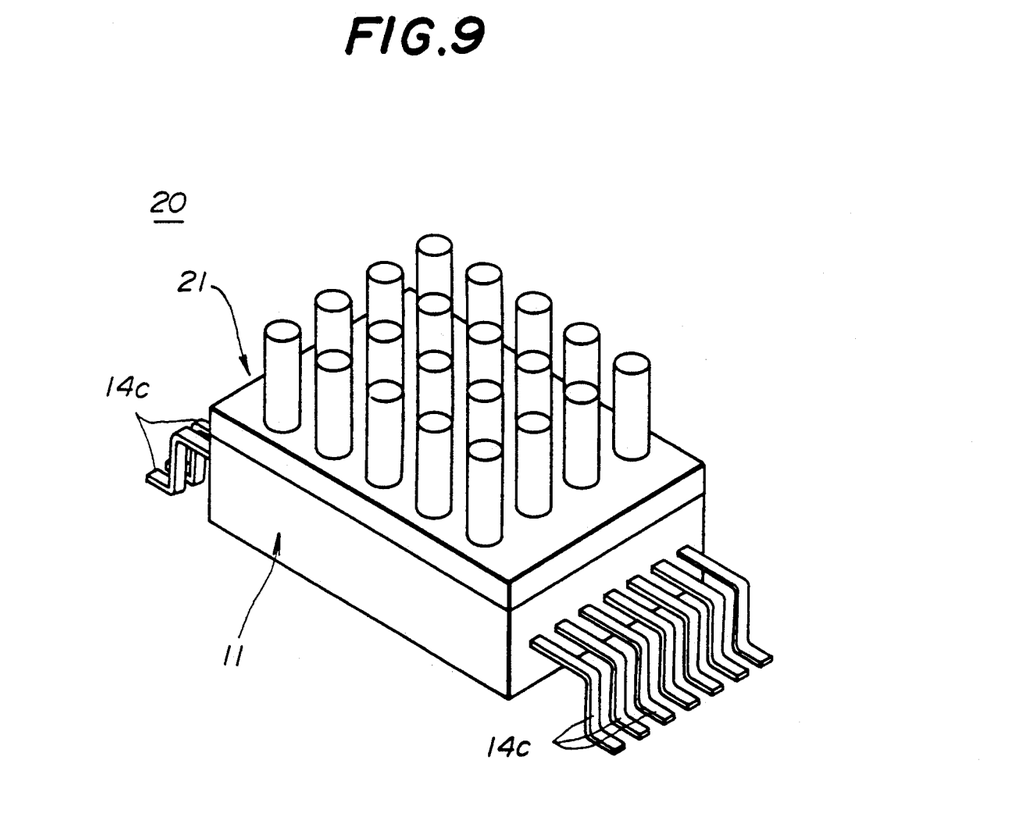
FIG. 9 is a perspective view of a second embodiment of the semiconductor device according to the present invention.

FIG. 9 shows a second embodiment of the semiconductor device according to the present invention. In this embodiment, a semiconductor device 20 generally includes the package part 11 and a radiation fin part 21. The radiation fin part 21 has an increased surface area compared to the radiation fin part 12 of the first embodiment. This radiation fin part 21 can be formed with ease by modifying the metal die 16 used in the first embodiment of the method. If a radiation fin part having the same shape as the radiation fin part 21 were to be made from a metal, it would be extremely difficult to shape the metal. In addition, the productivity would become poor, and the production cost would increase considerably. But the radiation fin part 21 is made of a resin, similarly as in the first embodiment. For this reason, the radiation fin part 21 can be made with a high productivity although its shape is complicated.

Figure 10:
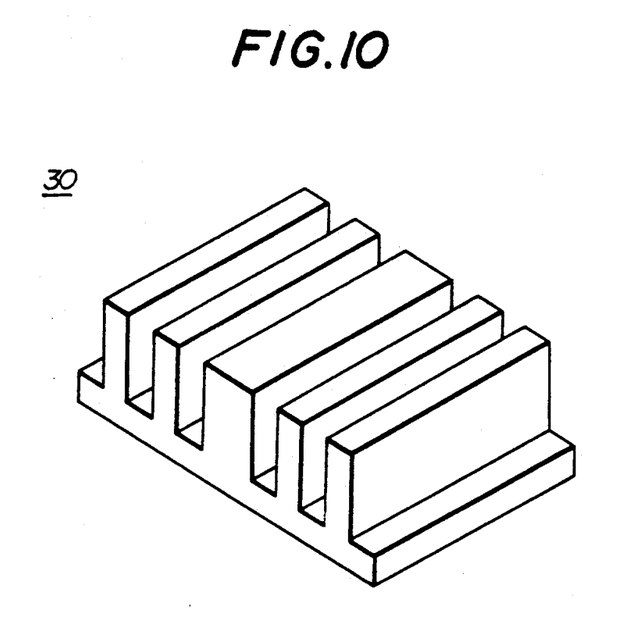
FIG. 10 is a perspective view of an embodiment of the radiation fins.
Figure 11:
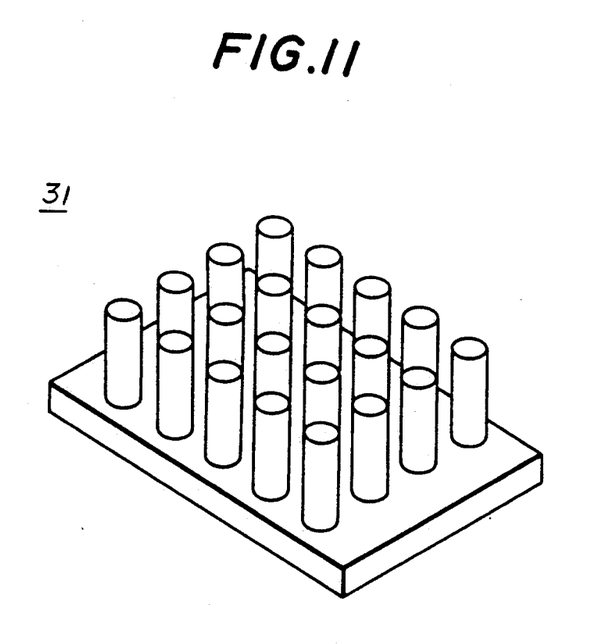
FIG. 11 is a perspective view of another embodiment of the radiation fins.

FIGS. 10 and 11 show embodiments of the radiation fin part which is used independently of the package part. FIG. 10 shows a radiation fin part 30 which is basically the same as the radiation fin part 12 of the first embodiment, and FIG. 11 shows a radiation fin part 31 which is basically the same as the radiation fin part 21 of the second embodiment. These radiation fin parts 30 and 31 may be used as a cooling fin of various devices and equipments other than the semiconductor devices 10 and 20 described above. Because the radiation fin parts 30 and 31 can be made with a high productivity regardless of the complicated shape thereof, the cost of the cooling fin can be reduced. In addition, since the radiation fin parts 30 and 31 are made of a resin and are lighter than the conventional metal radiation fin parts, it is suited for reducing the weight of the devices and equipments which require the cooling fin.

Next, a description will be given of a second embodiment of the method of producing the semiconductor device according to the present invention. In this embodiment, the semiconductor element 13 shown in FIG. 6 is pulled up against the lower wall of the upper die 15a by vacuum during the process of forming the package part 11, so that the connecting surface 11a of the package part 11 and the back surface 14a-1 of the stage 14a lie on substantially the same plane. Otherwise, the other processes are basically the same as those of the first embodiment of the method.

The shape of the radiation fin part is not limited to those of the embodiments described above. In addition, the radiation fin part of the described embodiments is shaped to increase the surface area thereof, however, the thermal conduction can also be achieved by using a radiation fin part which has a flat top surface.

According to experiments conducted by the present inventors, it was confirmed that the thermal conduction is improved by approximately 10 to 30% compared to the case where no radiation fin part is provided on the semiconductor device.

Further, the present invention is not limited to these embodiments, but various variations and modifications may be made without departing from the scope of the present invention.

What is claimed is:
1. A semiconductor device comprising:
 a stage having top and bottom surfaces;
 a semiconductor element mounted on the top surface of the stage;
 a package part made of a first resin which encapsulates the semiconductor element and the stage therewithin and such that a surface of the package part and the bottom surface of the stage lie in substantially a common plane; and a radiation part made of a second resin and molded directly on the bottom surface of the stage and the surface of the package part and thereby having a surface lying in the common plane and in integral and thermally conductive relationship with the bottom surface of the stage, said second resin including a filler material comprising metal powder and insulator powder materials selected to provide a value of thermal conduction of the second resin which is greater than that of the first resin, said radiation part having a fin structure extending outwardly from the surface thereof lying in the common plane.

2. The semiconductor device as claimed in claim 1, wherein;

the metal powder material is selected from the group consisting of gold (Au), silver (Ag), Aluminum (Al), copper (Cu) and nickel (Ni) powder materials; and the insulator powder material is selected from the group consisting of aluminum nitride (AlN), alumina ($Al_2O_3$) and boron nitride (BN) powder materials.

3. The semiconductor device as claimed in claim 1, wherein said second resin has a resistance of at least $10^{10}$ Ohms.

4. The semiconductor device as claimed in claim 1, wherein said first and second resins have approximately the same thermal expansion coefficient.

5. The semiconductor device as claimed in claim 1, wherein said stage has a concave part, and said semiconductor element is fit into the concave part so that the surface of the package part and the bottom surface of the stage lie on substantially the same plane.

6. The semiconductor device as claimed in claim 1, which further comprises a plurality of leads, which project outwardly from said package part and electrically connect to said semiconductor element within said package part.

* * * * *

UNITED STATES PATENT AND TRADEMARK OFFICE
CERTIFICATE OF CORRECTION

PATENT NO. : 5,296,740
DATED : March 22, 1994
INVENTOR(S) : MICHIO SONO ET AL

It is certified that error appears in the above-indentified patent and that said Letters Patent is hereby corrected as shown below:

On the title page, insert Item [30] Foreign Application Priority Data
March 20, 1991 [JP] 3-57314--

Signed and Sealed this

Second Day of August, 1994

Attest:

BRUCE LEHMAN

*Attesting Officer*  *Commissioner of Patents and Trademarks*